US010498334B2

(12) United States Patent
Asako et al.

(10) Patent No.: US 10,498,334 B2
(45) Date of Patent: Dec. 3, 2019

(54) ISOLATED POWER SOURCE APPARATUS

(71) Applicant: DENSO CORPORATION, Kariya, Aichi-pref. (JP)

(72) Inventors: Yosuke Asako, Kariya (JP); Yohei Kondo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/356,330

(22) Filed: Mar. 18, 2019

(65) Prior Publication Data

US 2019/0296653 A1 Sep. 26, 2019

(30) Foreign Application Priority Data

Mar. 20, 2018 (JP) ................................ 2018-052445

(51) Int. Cl.

| | |
|---|---|
| ***H03K 17/691*** | (2006.01) |
| ***H01F 27/28*** | (2006.01) |
| ***H01F 30/10*** | (2006.01) |
| *H02M 1/084* | (2006.01) |

(52) U.S. Cl.

CPC ....... *H03K 17/691* (2013.01); *H01F 27/2804* (2013.01); *H01F 30/10* (2013.01); *H02M 1/084* (2013.01)

(58) Field of Classification Search

CPC ............. H02M 1/084; H02M 3/33523; H02M 2001/0006; H01F 30/10; H03K 17/691

USPC .................. 363/21.12–21.18, 144, 146, 147

See application file for complete search history.

(56) References Cited

U.S. PATENT DOCUMENTS 3,162,830 A * 12/1964 Stanton, Jr. ............. H01F 30/10 336/208
4,038,626 A * 7/1977 Haydu ..................... H01H 9/44 337/4
7,561,389 B2 * 7/2009 Ishikawa .............. B60L 3/0069 361/42
9,712,038 B2 * 7/2017 Miyauchi ............. H02M 1/084
2011/0188271 A1 * 8/2011 Shinotsuka ........... H02M 3/335 363/21.15
2015/0085536 A1 3/2015 Miyauchi et al.

FOREIGN PATENT DOCUMENTS

JP 2015-065727 A 4/2015

* cited by examiner

*Primary Examiner* — Kyle J Moody
*Assistant Examiner* — Peter M Novak
(74) *Attorney, Agent, or Firm* — Oliff PLC

(57) ABSTRACT

An insulation power source apparatus for power conversion circuit provided with series connected circuits each composed of an upper arm switching element and a lower arm switching element. A power source control unit is disposed at one side of a connection region in a specific direction parallel to a plate surface of the substrate, an upper arm transformers are arranged between the power source control unit and the connection region in the specific region, and the lower arm transformer is arranged closer to the power source control unit in the specific direction than to an end portion of the connection region which is opposite side of a portion where the power source control unit is arranged.

6 Claims, 9 Drawing Sheets

MG1
10
MG2
20
(ON BOARD MAIN EQUIPMENT)
12
22
30
32
34
50
40
42
44
CONTROL UNIT
INTERFACE
HIGH VOLTAGE SYSTEM
LOW VOLTAGE SYSTEM
VstH
VstL
Trq*
gc#, g1¥#, g2¥#
(#=p, n)
(¥=U, V, W)
Mc
Scp
Dcp
gcp
Scn
Dcn
gcn
TC
TE
TA
M1U
M1V
M1W
M2U
M2V
M2W
S1Up
D1Up
g1Up
S1Un
D1Un
g1Un
S1Vp
D1Vp
g1Vp
S1Vn
D1Vn
g1Vn
S1Wp
D1Wp
g1Wp
S1Wn
D1Wn
g1Wn
S2Up
D2Up
g2Up
S2Un
D2Un
g2Un
S2Vp
D2Vp
g2Vp
S2Vn
D2Vn
g2Vn
S2Wp
D2Wp
g2Wp
S2Wn
D2Wn
g2Wn
U
V
W 200
DRIVE CIRCUIT
POWER SOURCE IC
VCC
Tfb1
GND
I3(=I1+3×I2)
Vfb1
CT1

200
DRIVE CIRCUIT
Dr2Up
S2Up
Dr2Vp
S2Vp
Dr2Wp
S2Wp
Dr2Un
S2Un
Dr2Vn
S2Vn
Dr2Wn
S2Wn
I4
I5(=3×I4)
90
90a
90b
92
92a
92b
92c
94
94a
94b
96
96a
96b
100a
100b
102a
102b
104a
104b
106a
106b
Ta1
Ta2
Ta3
Ta4
Ta5
Ta6
112
112a
112b
112c
112d
Vfb2
110
54
VCC
Tfb2
POWER SOURCE IC
GND
42
CT2

200
150
FC1
CT1
CT2
42
POWER SOURCE IC
52
54
80
110
Tfb1
Lfb1
Tfb2
Lfb2
L1
L2
L3
L4
LA
LB
Trr
Ta1
Ta2
Ta3
Ta4
60
62
64
66
68
90
92
94
96
Drcp
Tcp
Tcn
Drcn
Dr1Wp
T1Wp
T1Wn
Dr1Wn
Dr1Vp
T1Vp
T1Vn
Dr1Vn
Dr1Up
T1Up
T1Un
Dr1Un
Dr2Wp
T2Wp
T2Wn
Dr2Wn
Dr2Vp
T2Vp
T2Vn
Dr2Vn
Dr2Up
T2Up
T2Un
Dr2Un 200
150
FC1
LB
L3
L4
42
60
CT1
L1
L2
52
POWER SOURCE IC
Tfb1
Lfb1
80
Ta1
Ta2
Ta3
Ta4
62
64
66
68
LA
Dr1Up
T1Up
T1Un
Dr1Un
Dr1Vp
T1Vp
T1Vn
Dr1Vn
Dr1Wp
T1Wp
T1Wn
Dr1Wn
Drcp
Tcp
Tcn
Drcn
Trr
90
92
94
96
Dr2Un
T2Un
T2Up
Dr2Up
Dr2Vn
T2Vn
T2Vp
Dr2Vp
Dr2Wn
T2Wn
T2Wp
Dr2Wp
CT2
110
Tfb2
Lfb2
54

ISOLATED POWER SOURCE APPARATUS

CROSS-REFERENCE TO RELATED APPLICATION

This application is based on and claims the benefit of priority from earlier Japanese Patent Application No. 2018-52445 filed Mar. 20, 2018, the description of which is incorporated herein by reference.

BACKGROUND

Technical Field

The present disclosure relates to an isolated power source apparatus adapted for a power conversion apparatus provided with series-connected circuits each composed of an upper arm switching element and a lower arm switching element.

Description of the Related Art

As an isolated power source apparatus, for example, Japanese Patent Application Laid-Open Publication No. 2015-65727 discloses a power source apparatus provided with an upper arm transformer capable of supplying a drive power to the upper arm switching elements from a DC power source and a lower arm transformer capable of supplying a drive power to the lower arm switching elements. In a circuit board included in the isolated power source apparatus, the upper arm transformer and the lower arm transformer are disposed at mutually opposite sides with respect to a connection region for connecting the upper arm switching elements and the lower arm switching elements to the circuit board.

According to the above-described power source apparatus, the upper and lower arm transformers are arranged at mutually opposite sides with respect to the connection regions. For this reason, the input impedance between the DC power source and respective primary coils that constitute the transformers is difficult to equalize. Hence, the difference of input impedance may cause voltage difference between voltages to be supplied to the upper arm switching elements and the lower arm switching elements.

SUMMARY

The present disclosure has been achieved in light of the above-described circumstances and provides an insulated power source apparatus capable of suppressing voltage difference occurring between voltages to be supplied to the upper arm switching elements and the lower arm switching elements.

The present disclosure provides an insulated power source apparatus for a power conversion circuit provided with a series-connected circuit composed of an upper arm switching element and a lower arm switching element, the power conversion circuit including a plurality of series connected circuits connected in parallel to each other to generate a parallel-connected circuit. The insulated power source apparatus includes: a substrate; an upper arm transformer mounted on the substrate, including a primary coil capable of being connected to a DC power source, and a secondary coil capable of supplying an upper arm drive power to the upper arm switching element; a lower arm transformer mounted on the substrate, including a primary coil capable of being connected to the DC power source, and a secondary coil capable of supplying a lower arm drive power to the lower arm switching element; a wiring provided on the substrate, connecting the primary coil constituting each of the upper arm transformer and the lower arm transformer, and the DC power source; a power source control unit mounted on the substrate, including a control switch and a control circuit, the control switch switching between ON and OFF to apply voltage of the DC power source to the primary coil constituting each of the upper arm transformer and the lower arm transformer, and the control circuit turns the control switch ON and OFF; a plurality of upper arm connection portions connecting a plurality of upper arm switching elements to the substrate; and a plurality of lower arm connection portions connecting a plurality of upper arm switching elements to the substrate.

The control switch is provided to be capable of forming a closed circuit including the DC power source, a plurality of primary coils constituting the upper arm transformer and the lower arm transformer and the control switch, when the control switch is turned ON; the power source control unit is disposed on one side of a connection region on the substrate where the upper arm connection portions and the lower arm connection portions are provided, with respect to a specific direction parallel to a plate surface of the substrate; the upper arm transformer is arranged between the power source control unit and the connection region in the specific direction; and the lower arm transformer is arranged closer to the power source control unit in the specific direction than to an end portion of the connection region which is on an opposite side of a portion where the power source control unit is arranged.

In the case where the upper arm transformers and the lower arm transformers are arranged apart from each other on the circuit board, lengths of the wiring patterns between the DC power source and respective transformers become different. This causes difference in the input impedances between the DC power source and the primary coils which constitute respective transformers. Hence, voltages between transformers and the respective switching elements become different.

According to the present disclosure, the upper arm transformers are arranged close to the power source control unit with respect to the connection region, and the lower arm transformers are arranged closer to the power source control unit in the specific direction than to an end portion of the connection region which is opposite side of a portion where the power source control unit is arranged. Hence, the upper arm transformers and the lower arm transformers can be disposed to be closer to each other, compared to a case where the lower arm transformers are arranged in a portion opposite to the power control units with respect to the end portion, that is, a portion opposite to the upper arm transformers with respect to the connection region. Thus, input impedances between the DC power source and the primary coils which constitute respective transformers can be prevented from being different. Further, voltage differences can be prevented from occurring in the voltages supplied to the upper arm switching elements and the lower arm switching elements.

DETAILED DESCRIPTION OF THE PREFERRED EMBODIMENTS

First Embodiment

Hereinafter, an insulated power source apparatus according to the present disclosure will be described with reference to the drawings.

As a first embodiment, a power source apparatus of the present disclosure is adapted to a hybrid vehicle provided with a rotary electric machine as an on-board main equipment and an engine.

Figure 1:
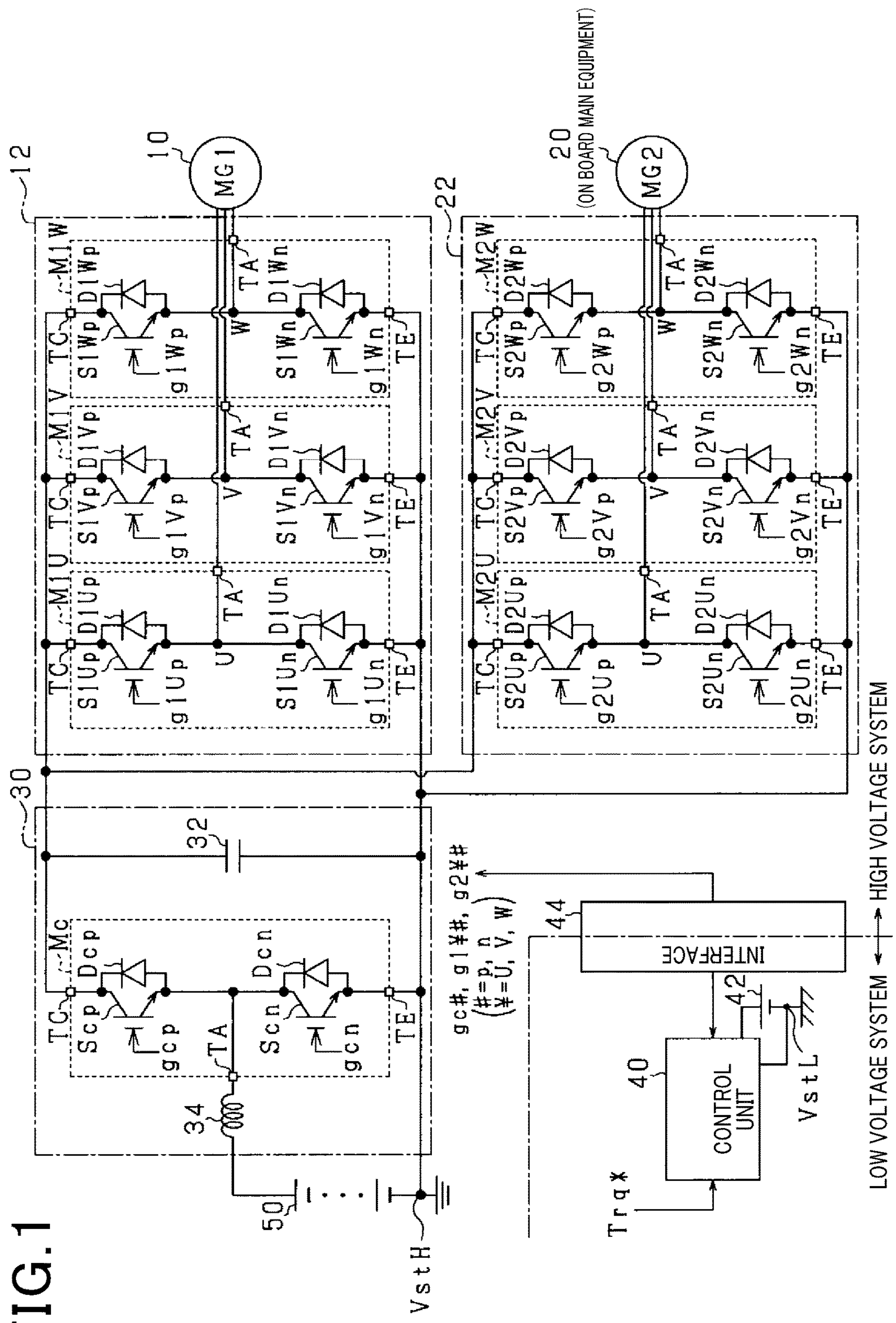
FIG. 1 is an overall configuration of a motor control system.

As shown in FIG. 1, a motor control system according to the present embodiment is provided with a first motor generator 10, a second motor generator 20, a first inverter 12 a second inverter 22, a boost converter 30, a control unit 40 and an interface 44. The first motor generator 10 and the second motor generator 20 are coupled to driving wheels or an engine as on-board main equipment via a power dividing mechanism. The first motor generator 10 is connected to the first inverter 12 and serves as a starter that applies an initial rotation to the crank shaft of the engine or a generator that supplies power to on-board equipment. On the other hand, the second motor generator 20 is connected to the second inverter 22 and serves as on-board main equipment. Each of the first and second inverters 12 and 22 is configured as a three phase inverter, and connected to a high voltage battery 50 (e.g. lithium ion secondary battery or a nickel hydrogen battery) via the boost converter 30. According to the present embodiment, each of the first inverter 12, the second inverter 22 and the boost converter 30 corresponds to power conversion circuit, the first inverter 12 and the boost converter 30 correspond to the first power conversion circuit, and the second inverter 22 corresponds to the second power conversion circuit.

The boost converter 30 is provided with a capacitor 32, a reactor 34, an upper arm boost switching element Scp, and a lower arm boost switching element Scn. Specifically, these boost switching elements Scp and Scn are connected in series to each other. The series-connected circuit composed of the upper arm switching element Scp and the lower arm switching element Scn is connected in parallel to the capacitor 32, and the connection point of the above-described series connected circuit is connected to the positive terminal of the high voltage battery 50 via the reactor 34. The boost switching elements Scp and SCn boost the output voltage (e.g. 288V) of the high voltage battery 50 not to exceed a predetermined voltage (e.g. 650V) as an upper limit.

The first inverter 12 includes three series-connected circuits composed of first $-phase arm switching elements S1$p ($=U,V,W) and first $-phase lower arm switching elements S1$n. The second inverter 22 includes three series-connected circuits composed of second $-phase arm switching elements S2$p ($=U,V,W) and second $-phase lower arm switching elements S2$n.

According to the present embodiment, voltage controlled type semiconductor switching elements are used for the above-described switching elements Sc#, S1$#, S2$# (#=p, n). More specifically, IGBT (Insulated Gate Bipolar Transistor) is used. The free-wheel diodes Dc#, D1$#, and D2$# are reverse-connected in parallel to the switching elements Sc$, S1$#, S2$#.

According to the present embodiment, each of the upper arm boost switching elements Scp, the first $-phase upper arm switching elements S1$p and the second $-phase upper arm switching elements S2$p corresponds to upper arm switching element. Moreover, each of the lower arm boost switching element Scn, the first $-phase lower arm switching elements S1$n and the second $-phase lower arm switching elements S2$n corresponds to the lower arm switching element.

The upper arm boost switching element Scp, the free-wheel diode Dcp reverse-connected in parallel to the upper arm boost switching element Scp, the lower arm boost switching element Scn, and the free-wheel diode Dcn reverse-connected in parallel to the lower arm boost switching element Scn.

Also, the first $-phase upper arm switching element S1$p, the free-wheel diode D1$p reverse-connected in parallel to the first $-phase upper arm switching element S1$p, the first $-phase lower arm switching elements S1$n, and the free-wheel diode D1$n reverse-connected in parallel to the first $-phase lower arm switching element S1$n constitute a module to configure the first $-phase module M1$.

Moreover, the second $-phase upper arm switching element S2$p, the free-wheel diode D2$p reverse-connected in parallel to the second $-phase upper arm switching element S2$p, the second $-phase lower arm switching elements S2$n, and the free-wheel diode D2$n reverse-connected in parallel to the second $-phase lower arm switching element S2$n constitute a module to configure the second $-phase module M2$.

The collector terminals TC of the boost module Mc, the first $-phase module M1 and the second $-phase module M2 are tied together. Further, the emitter terminals TE of the boost module Mc, the first $-phase module M1 and the second $-phase module M2 are connected to the negative terminal of the high voltage battery 50.

The connection terminal TA of the first $-phase module M1 is connected to the $-phase of the first motor generator 10. The connection terminal TA of the second $-phase module M2 is connected to the $-phase of the second motor generator 20. On the other hand, the connection terminal TA of the boost module Mc is connected to one end of the reactor 34 which is opposite to the other end of the reactor 34 connected to the positive terminal of the high voltage battery 50.

The control unit 40 is powered by a low voltage battery 42 and mainly constituted of a microprocessor. The control unit 40 operates the first and second inverters 12 and 22, and the boost converter 30 such that the control amount (i.e. torque) of the first and second motor generator 10 and 20 to be the command value (hereinafter referred to as command torque Trq*). Specifically, the control unit 40 generates the operational signals g1$# and outputs them to the drive circuits of the switching elements S1$# such that switching elements S1$# which constitute the first inverter 12 are switched ON and OFF. Further, the control unit 40 generates the operational signals g2$# and outputs them to the drive circuits of the switching elements S2$# such that the switching elements S2$# which constitute the second inverter 22 are ON and OFF. Furthermore, the control unit 40 generates the operational signals gc# and outputs them to the drive circuits of the switching elements Sc# such that the switching elements Sc# which constitute the boost converter 30 to be ON and OFF. According to the present embodiment, the low voltage battery 42 corresponds to the DC power source.

Figure 2:
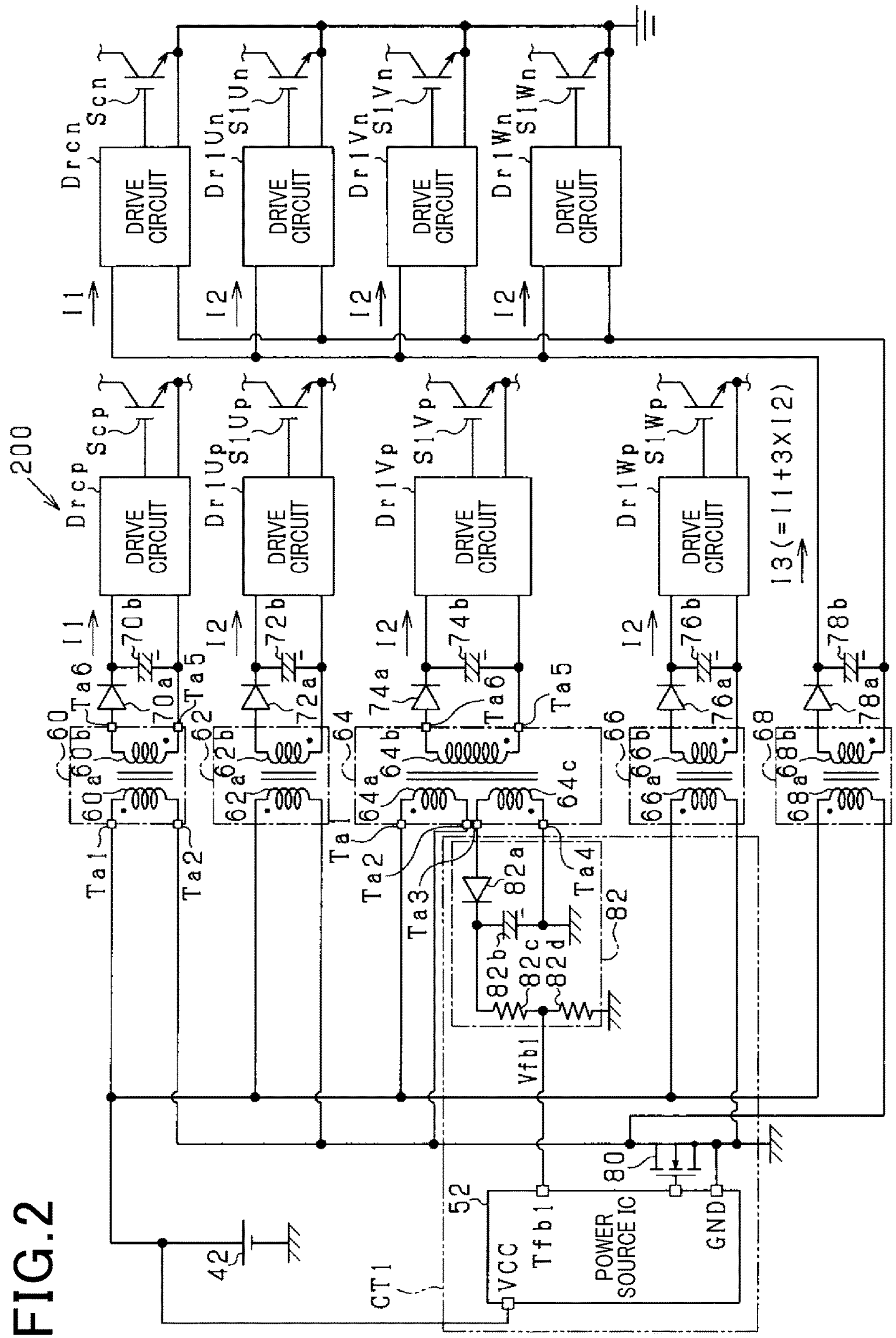
FIG. 2 is a circuit diagram showing an insulated power source apparatus.

In the above-description, the drive circuits which drive the upper and lower arm switches Scp and Scn are referred to as upper ad lower arm boost drive circuits Drcp and Drcn (see FIG. 2), and the drive circuits which drive the first $-phase upper and lower arm switching elements S1$p and S1$n are referred to as the first $-phase upper and lower arm drive circuits Dr1$p and Dr1$n (see FIG. 2). Also, the drive circuits which drive the second $-phase upper and lower arm switching elements S2$p and S2$n are referred to as the second $-phase upper and lower arm drive circuits Dr2$p and Dr2$n (see FIG. 3)

Each of the drive circuits Drcp, Dr1$p and Dr2$p is referred to as the upper arm drive circuit, and each of the drive circuits Drcn, Dr1$n, Dr2$n is referred to as a lower arm drive circuit. That is, the control unit 40 includes the upper arm drive circuit and the lower arm drive circuit individually, in which the upper arm drive circuit is provided corresponding to respective upper arm switching elements and the lower arm drive circuit is provided corresponding to respective lower arm switching elements.

Note that the upper arm operational signals gcp, g1$p and g2$p, and corresponding lower arm operational signals gcn, g1$n, g2$n are complementary signals. In other words, the upper arm switching elements Scp, S1$p, S2$p, and corresponding lower arm switching elements Scn, S1$n, S2$n complementary turn ON.

The low voltage battery 42 (also referred to as auxiliary battery) is a storage battery of which the output voltage is lower than that of the high voltage battery 50 (e.g. lead-acid battery).

The interface 44 isolate a high voltage system including the high voltage battery 50, the first and second inverters 12 and 22, the boost converter 30, the first and second motor generator 10 and 20, and a low voltage system including the low voltage battery 42 and the control unit 40, and transmits signals between the high voltage system and the low voltage system. According to the present embodiment, the interface 44 is provided with an optically isolation element (i.e. photo coupler). In the present embodiment, the reference potential VstL of the low voltage system and the reference potential VstH of the high voltage system are different. Especially, according to the present embodiment, the reference potential VstH of the high voltage system is set to be the same potential as the negative terminal of the high voltage battery 50, and the reference potential VstL of the low voltage system is set to be the potential of the vehicle body which is an intermediate potential between the potential at the positive terminal and the potential at the negative terminal of the high voltage battery 50.

Figure 3:
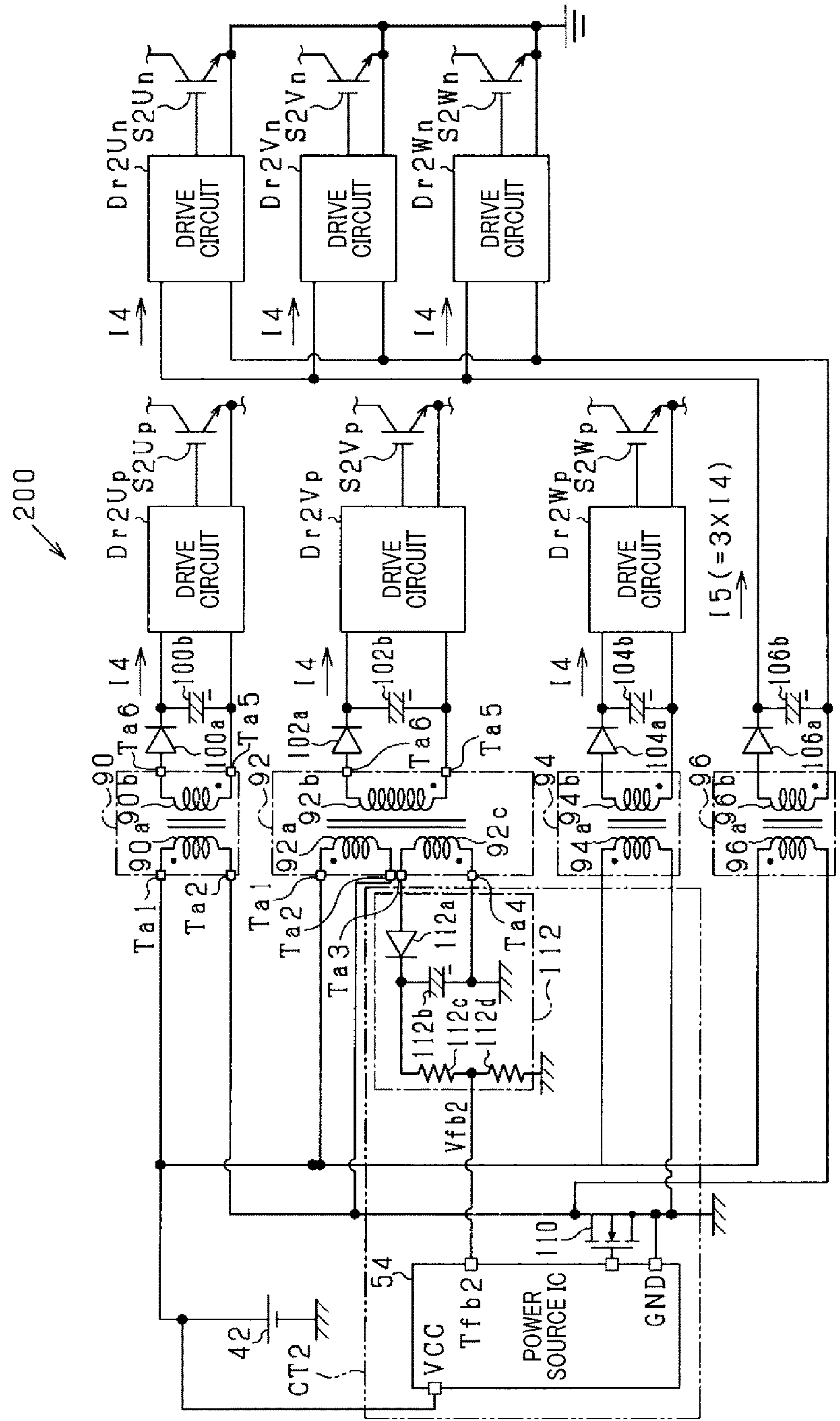
FIG. 3 is a circuit diagram showing an insulated power source apparatus.

Subsequently, an insulated power source apparatus 200 according to the present embodiment will be described. The insulated power source apparatus 200 supplies a drive voltage to the drive circuits Drc# and Dr1$# which drive respective switching elements Sc#, S1$# and S2$#. FIGS. 2 and 3 are block diagrams showing an example of circuit diagrams of the insulated power source apparatus 200.

The insulated power source apparatus 200 is provided with a first power source IC 52 and a second power source IC 54. According to the present embodiment, the first inverter 12, the second inverter 22 and the boost converter 30 are divided into a group including the first inverter 12 and the boost converter 30, and the second inverter 22. Then, the first power source IC 52 is provided for the group of the first inverter 12 and the boost converter 30, and the second power source IC 54 is provided for the second inverter 22. The first power source IC 52 controls the drive voltages supplied to the upper and lower arm boost drive circuits Drcp and Drcn, and the first $-phase upper and lower arm drive circuits Dr1$p and Dr1$n. The second power source IC 54 controls the drive voltages supplied to the second $-phase upper and lower arm drive circuits Dr2$p and Dr2$n.

FIG. 2 illustrates a control circuit based on the first power source IC 52 in the power source apparatus 200.

The insulated power source apparatus 20 shown in FIG. 2 is configured as a switching power supply using a fly-back topology, including the first to fifth transformers 60, 62, 64, 66 and 68, the first to fifth diodes 70*a*, 72*a*, 74*a*, 76*a* and 78*a*, the first to fifth capacitors 70*b*, 72*b*, 74*b*, 76*b* and 78*b*, a single N-channel MOSFET (hereinafter referred to as first voltage controlled switching element 80), and the first feedback circuit 82. According to the present embodiment, electrolytic capacitors are used for the first to fifth capacitors 70*b*, 72*b*, 74*b*, 76*b* and 78*b*. Further, according to the present embodiment, each of the first to fourth transformers 60, 62, 64 and 66 corresponds to upper arm transformer and the fifth transformer 68 corresponds to lower arm transformer. The first voltage controlled switching element 80 corresponds to control switch.

The upper arm transformer is provided for respective upper arm switching elements. Specifically, the first transformer 60 supplies the drive voltage to the upper arm boost drive circuit Drcp, and the second transformer 62 supplies the drive voltage to the first U-phase upper arm drive circuit Dr1Up. Further, the third transformer 64 supplies the drive power to the first V-phase upper arm drive circuit Dr1Vp, and the fourth transformer 66 supplies the drive voltage to the first W-phase upper arm drive circuit Dr1Wp.

On the other hand, the lower arm transformer is provided commonly for respective lower arm switching elements. Specifically, the fifth transformer 68 as the above-described common transformer supplies the drive voltage to the lower arm boost drive circuit Drcn and the first $-phase lower arm drive circuits Dr1$n.

The positive terminal of the low voltage battery 42 is connected to a parallel connected circuit composed of the first to fifth primary coils 60*a*, 62*a*, 64*a*, 66*a* and 68*a* which constitute the first to fifth transformer 60, 62, 64, 66 and 68, and the negative terminal of the low voltage battery 42 via the first voltage controlled switching element 80. In other words, the first voltage controlled switching element 80 is controlled to be ON to form a closed circuit including the parallel connected circuits of the first to fifth primary coils 60*a*, 62*a*, 64*a*, 66*a* and 68*a*, the low voltage battery 42 and the first voltage controlled switching element 80. Hence, the voltage of the low voltage battery 42 is applied to the first to fifth primary coils 60*a*, 62*a*, 64*a*, 66*a* and 68*a*.

The first secondary coil 60*b* that constitutes the first transformer 60 is connected to the upper arm boost drive circuit Drcp via the first diode 70*a* and the first capacitor 70*b*. Also, the secondary coil 62*b* that constitutes the second transformer 62 is connected to the first U-phase upper arm drive circuit Dr1Up via the second diode 72*a* and the second capacitor 72*b*. Further, the secondary coil 64*b* that constitutes the third transformer 64 is connected to the first V-phase upper arm drive circuit Dr1Vp via the third diode 74*a* and the third capacitor 74*b*. The secondary coil 66*b* that constitutes the fourth transformer 66 is connected to the first W-phase upper arm drive circuit Dr1Wp via the fourth diode 76*a* and the fourth capacitor 76*b*.

The third transformer 64 is provided with the first feedback coil 64*c* as a voltage detection coil. The first feedback coil 64*c* is connected to the first power source IC 52 via the first feedback circuit 82. Specifically, the first feedback circuit 82 includes the first detection diode 82*a*, the first detection capacitor 82*b*, the first resistor 82*c*, and the second resistor 82*d*. The first feedback circuit 82 has a rectification function in which the output voltage of the first feedback coil 64*c* is converted to DC voltage. The output voltage of the first feedback coil 64*c* is divided by the first resistor 82*c* and the second resistor 82*d* after passing through the first detection diode 82*a*. The voltage divided by the first resistor 82*c* and the second resistor 82*d* (hereinafter referred to as first feedback voltage Vfb1) is transferred to the first power source IC 52 via the first detection terminal Tfb1.

The fifth secondary coil 68*b* that constitutes the fifth transformer 68 is connected to the lower arm boost drive circuit Drcn and the first $-phase lower arm drive circuit Dr1$n via the fifth diode 78*a* and the fifth capacitor 78*b*.

According to the present embodiment, the winding number of the first to fifth secondary coils 60*b*, 62*b*, 64*b*, 66*b*, and 68*b* and the winding number of the first feedback coil 66*c* are set to be the same number. Thus, the output voltage of the first feedback coil 64*c* and the output voltages of the first to fifth secondary coils 60*b*, 62*b*, 64*b*, 66*b* and 68*b* can be the same voltage.

The first power source IC 51 is configured as a single integrated circuit and controls the first voltage controlled switching element 80 to be ON and OFF such that the first feedback voltage Vfb1 becomes the target voltage Vtgt. According to the present embodiment, the first power source control unit CT1 is configured to include the first power source IC 52, the first voltage controlled switching element 80, and the first feedback circuit 82.

Here, according to the present embodiment, the winding ratio between the first to fourth transformers 60, 62, 64 and 66 as the upper arm transformers (i.e. the winding number of the secondary coil is divided by the winding number of the primary coil) is set to be lower than that of the fifth transformer 68 as the lower arm transformer. Thus, fluctuation of the output voltages of the first to fifth transformers 60, 62, 64, 66, 68 can be suppressed.

According to the present embodiment, current I3 supplied to the lower arm boost drive circuit Drcn or the first U, V, W phase lower arm drive circuits Dr1Un, Dr1Vn and Dr1Wn from the fifth secondary coil 68*b*, is larger than current I1 suppled to the upper arm boost drive circuit Drcp from the first secondary coil 60*b* or current I2 supplied to the first U, V, W phase upper arm drive circuit Dr1Up, Dr1Vp and Dr1Wp from the second to fourth secondary coils 62*b*, 64*b*, and 66*b*. Thus, the output voltage of the first to fifth transformers 60, 62, 64, 66 and 68 can be prevented from fluctuating.

FIG. 3 illustrates a control circuit based on the second power source IC 54 in the power source apparatus 200.

The insulated power source apparatus 300 shown in FIG. 3 is configured as a switching power supply using a fly-back topology, including the sixth to ninth transformers 90, 92, 94 and 96, the sixth to ninth diodes 100*a*, 102*a*, 104*a* and 106*a*, the sixth to ninth capacitors 100*b*, 102*b*, 104*b* and 106*b*, and a single N-channel MOSFET (hereinafter referred to as second voltage controlled switching element 110), and the second feedback circuit 112. According to the present embodiment, electrolytic capacitors are used for the sixth to ninth capacitors 100*b*, 102*b*, 104*b* and 106*b*. Further, according to the present embodiment, each of the sixth to eighth transformers 90, 92 and 94 corresponds to upper arm transformer and the ninth transformer 96 corresponds to lower arm transformer.

The sixth transformer 90 supplies the drive voltage to the second U-phase upper arm drive circuit Dr2Up. The seventh transformer 92 supplies drive voltage to the second V-phase upper arm drive circuit Dr2Vp. The eighth transformer 94 supplies the drive voltage to the second W-phase upper arm drive circuit Dr2Wp. On the other hand, the ninth transformer 96 supplies the drive voltage to the second U, V, W phase lower arm drive circuit Dr2Un, Dr2Vn and Dr2Wn.

The positive terminal of the low voltage battery 42 is connected to a parallel connected circuit composed of the sixth to ninth primary coils 90*a*, 92*a*, 94*a* and 96*a* which constitute the sixth to ninth transformers 90, 92, 94 and 96, and the negative terminal of the low voltage battery 42 via the second voltage controlled switching element 110. In other words, the second voltage controlled switching element 110 is controlled to be ON to form a closed circuit including the parallel connected circuits of the sixth to ninth primary coils 90*a*, 62*a*, 92*a*, 94*a* and 96*a*, the low voltage battery 42 and the second voltage controlled switching element 110. Hence, the voltage of the low voltage battery 42 is applied to the sixth to ninth primary coils 90*a*, 92*a*, 94*a* and 96*a*.

The sixth secondary coil 90*b* that constitutes the sixth transformer 90 is connected to U-phase upper arm drive circuit Dr2Up via the sixth diode 100*a* and the sixth capacitor 100*b*. Also, the secondary coil 92*b* that constitutes the seventh transformer 92 is connected to the second V-phase upper arm drive circuit Dr2Vp via the seventh diode 102*a* and the seventh capacitor 102*b*. Further, the secondary coil 94*b* that constitutes the eighth transformer 94 is connected to the second W-phase upper arm drive circuit Dr2Wp via the eighth diode 104*a* and the eighth capacitor 104*b*.

The third transformer 92 is provided with the second feedback coil 92*c* as a voltage detection coil. The first feedback coil 92*c* is connected to the second power source IC 54 via the second feedback circuit 112. Specifically, the second feedback circuit 112 includes the second detection diode 112*a*, the second detection capacitor 112*b*, the third resistor 112*c*, and the fourth resistor 112*d*. The output voltage of the second feedback coil 92*c* is divided by the third resistor 112*c* and the fourth resistor 112*d* after passing through the second detection diode 112*a*. The voltage divided by the third resistor 112*c* and the fourth resistor 112*d* (hereinafter referred to as second feedback voltage Vfb2) is transferred to the second power IC 54 via the second detection terminal Tfb2.

The ninth secondary coil 96*b* that constitutes the ninth transformer 96 is connected to the second $-phase lower arm drive circuit Dr2$n via the ninth diode 106*a* and the ninth capacitor 106*b*.

According to the present embodiment, the winding number of the sixth to ninth secondary coils 90*b*, 92*b*, 94*b* and 96*b* and the winding number of the second feedback coil 92*c* are set to be the same number. Thus, the output voltage of the second feedback coil 92*c* and the output voltages of the sixth to ninth secondary coils 90*b*, 92*b*, 94*b* and 96*b* can be the same voltage.

The second power source IC 54 is configured as a single integrated circuit and controls the second voltage controlled switching element 110 to be ON and OFF such that the second feedback voltage Vfb2 becomes the target voltage Vtgt. According to the present embodiment, the second power source control unit CT2 is configured to include the second power source IC 54, the second voltage controlled switching element 110, and the second feedback circuit 112.

Here, according to the present embodiment, the winding ratio between the sixth to eighth transformers 90, 92 and 94 as the upper arm transformers is set to be lower than that of the ninth transformer 96 as the lower arm transformer. Thus, fluctuation of the output voltages of the sixth to ninth transformers 90, 92, 94 and 96 can be suppressed.

Figure 4:
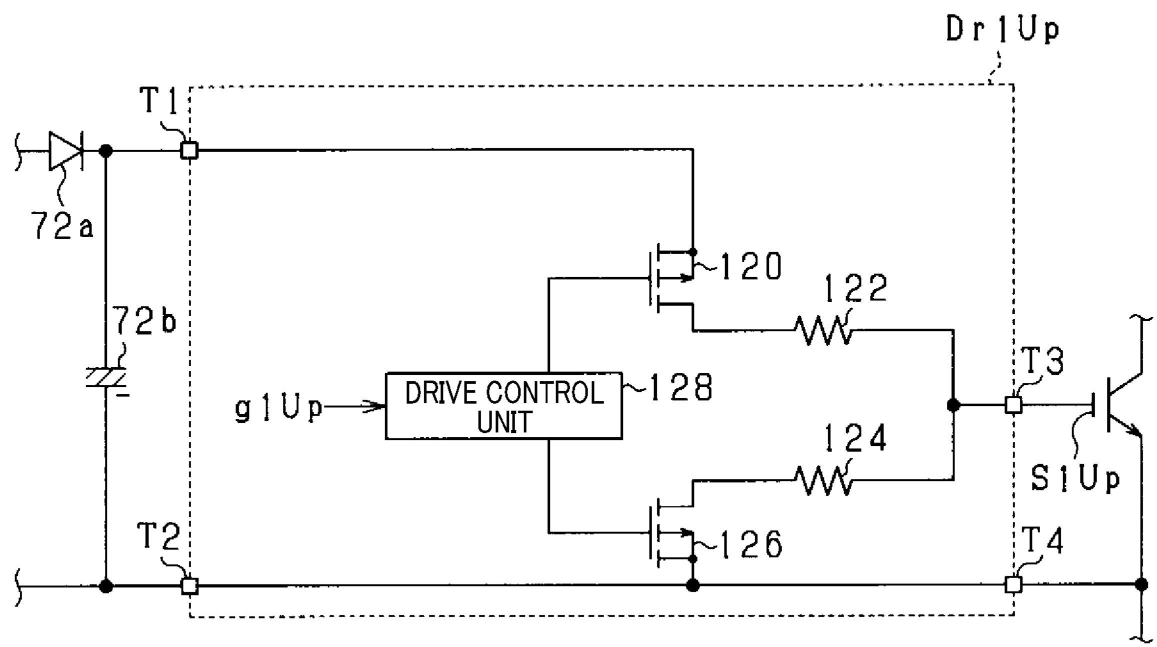
FIG. 4 is a diagram showing a drive circuit.

Subsequently, with reference to FIG. 4, detailed configuration of the drive circuits Drc#, Dr1$# and Dr2# according to the present embodiment will be described. In the present embodiment, the configurations of these drive circuits Drc#, Dr1$# and Dr2# are the same. Hence, as an example, the configuration of the first U-phase upper arm drive circuit Dr1Up will be described.

Figure 6:
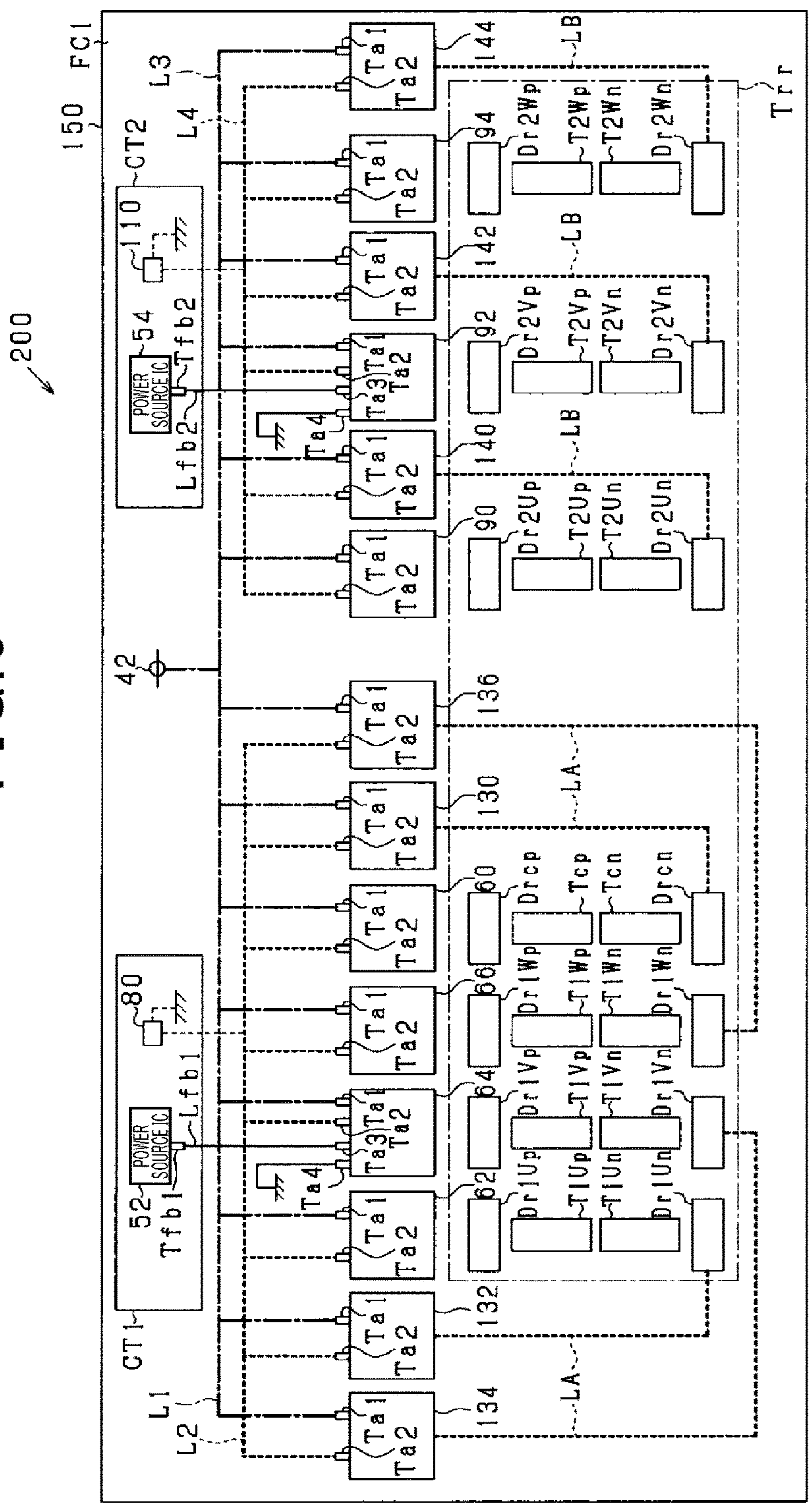
FIG. 6 is a plan view showing an insulated power source apparatus according to a second embodiment.

The connection point between the second diode 72*a* and the second capacitor 72*b* is connected to the first terminal T1 of the first U-phase upper arm drive circuit Dr1Up shown in FIG. 6. The connection point between the secondary coil 62*b* and the second capacitor 72*b* is connected to the second terminal T2 of the first U-phase upper arm drive circuit Dr1Up.

The first terminal T1 is connected to the gate of the first U-phase upper arm switching element S1UP via the P-channel MOSFET (hereinafter referred to as charge switching element 120), a charge resistor 122, and the third terminal T3 of the first U-phase upper arm drive circuit Dr1Up. Also, the gate of the first U-phase upper arm switching element S1UP is connected to the emitter of the first U-phase upper arm switching element S1Up via the third terminal T3, the discharge resistor 124, the N-channel MOSFET (hereinafter referred to as discharge switch 126), and the fouth terminal T4 of the first U-phase upper arm drive circuit Dr1Up. Moreover, the second terminal T2 is connected to the fourth terminal T4 in the first U-phase upper arm drive circuit Dr1Up.

The first U-phase upper arm drive circuit Dr1Up includes a drive control unit 128. The drive control unit 128 alternately performs a charge process and a discharge process by operating the charge switching element 120 and the discharge switching element 126 based on the operational signal g1UP transmitted from the control unit 40 via the interface 44, thereby driving the first U-phase upper arm switching element S1Up. Specifically, the charge process turns the discharge switching element 125 OFF when determined that the operational signal g1UP becomes an ON command and turns the charge switching element 120 ON. On the other hand, the discharge process turns the discharge switching element 126 ON and the charge switching element OFF when determined that the operational signal g1UP becomes an OFF command, thus driving the first U-phase upper arm switching element S1UP.

Subsequently, for the configuration of each transformer, the third transformer 64 will be exemplified. As shown in FIG. 2, the third transformer 64 is provided with the first to sixth transformer terminals Ta1 to Ta6. The first to fourth transformer terminals T11 to Ta4 among the first to sixth transformer terminals Ta1 to Ta6 is disposed facing one side of the third transformer 64. The fifth and sixth transformer terminals Ta5 and Ta5 are disposed facing the opposite side of the third transformer 64.

The one end of the third primary coil 64*a* is connected to the first transformer terminal Ta1 and the other end is connected to the second transformer terminal Ta2. The first transformer terminal Ta1 is connected to the positive terminal of the low voltage battery 42, and the second transformer terminal Ta2 is connected to the first voltage controlled switching element 80.

One end of the first feedback coil 64*c* is connected to the third transformer terminal Ta3, and the other end is connected to the fourth transformer terminal Ta4. The third transformer terminal Ta3 is connected to the anode of the first detection diode 82*a*, and the fourth transformer terminal Ta4 is grounded.

One end of the fourth secondary coil 66 is connected to the sixth transformer terminal Ta6 and the other end is connected to the fifth transformer terminal Ta5. The sixth transformer terminal Ta6 is connected to the anode of the third diode 74*a* and the fifth trans former terminal Ta5 is connected to the negative terminal of the third capacitor 74*b*.

According to the present embodiment, feedback coils are not included in the first and second transformer 60 and 62, the fourth to sixth transformer 66, 68 and 90, and the eighth and ninth transformer 94 and 96. Hence, the third transformer terminal Ta3 and the fourth transformer terminal Ta4, and the first feedback coil 66*c* are removed in each structure of the transformers 60, 63, 66, 68, 90, 94 and 96.

Figure 5:
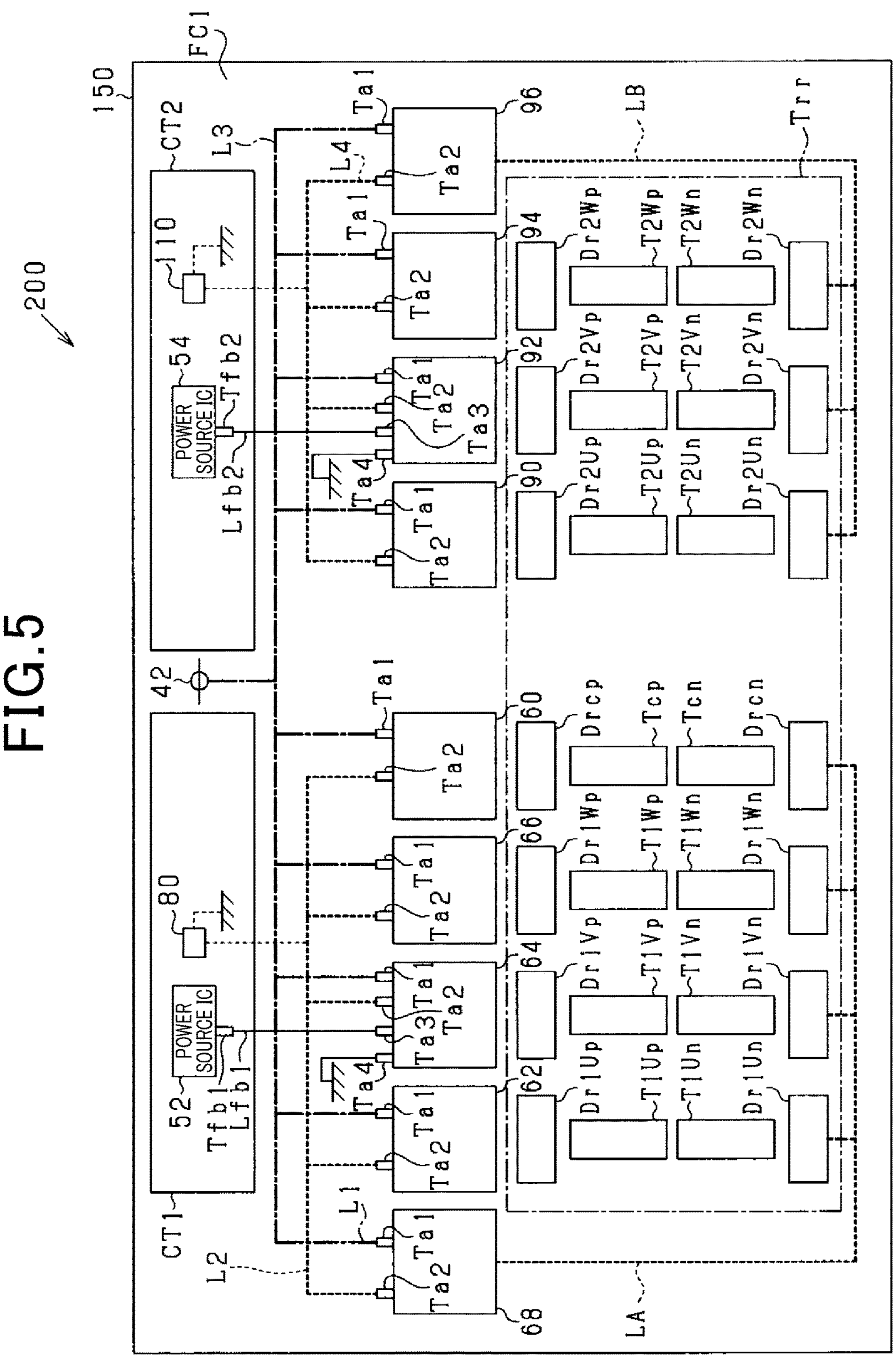
FIG. 5 is a plan view showing an insulated power source apparatus according to a first embodiment.

Subsequently, with reference to FIG. 5, arrangement of the transformer or the like in the substrate 150 will be described. In FIG. 5, illustration of the first feedback circuit 82 and the second feedback circuit 12, and the fifth and sixth transformer terminals Ta5 and Ta6 included in the transformers are omitted.

As shown in FIG. 5, the substrate 150 is configured as a multi-layered substrate having a rectangular shape. The substrate 150 includes a pair of outer layers (first surface FC1 and second layer FC2 which is a back surface of the first surface FC1), and a plurality of inner layers which is sandwiched between the pair of outer layers. The upper arm boost switching element Scp, the first $-phase upper arm switching elements S1$p and the second $-phase upper arm switching elements S2$p are connected to the boost upper arm connection portion Tcp, the first $-phase upper arm connection portion T1$p, and the second $-phase upper arm connection portion T2$p which are disposed on the first surface FC1 of the substrate 150, respectively. According to the present embodiment, the substrate 150 corresponds to substrate. Also, the first surface FC1 corresponds to plate surface, first plate surface, and the second surface FC2 corresponds to second plate surface.

The boost upper arm connection portion Tcp and the first $-phase upper arm connection portion T1$p (hereinafter referred to as first upper arm connection portion) are arranged to be in series in the long-side direction of the substrate 150 (hereinafter referred to as long-side direction) in a front view of the first surface FC1 of the substrate 150. The first upper arm connection portion Tcp, T1$p are arranged in a center portion of the substrate 150 with respect to the short side direction perpendicular to the long side direction of the substrate 150 and in a direction parallel to the first surface FC1 of the substrate 150. According to the present embodiment, the short side direction corresponds to specific direction.

On the other hand, the second $-phase upper arm connection portion T2$p (hereinafter referred to as second upper arm connection portion) are arranged to be in series in the long-side direction of the substrate 150 in a front view of the first surface FC1 of the substrate 150. The second upper arm connection portion T2$p is disposed in the center portion with respect to the short-side direction of the substrate 150 and in a direction parallel to the first surface FC1 of the substrate 150. The second upper arm connection portion T2$p and the first upper arm connection portion Tcp, T1$p are arranged to be in series in a front view of the first surface FC1 of the substrate 150. Specifically, the first $-phase upper arm connection portion T1$p, the boost upper arm connection portion Tcp, and the second $-phase upper arm connection portion T2$p are arranged to be in series in the long-side direction in this order.

The lower arm boost switching element Scn, the first $-phase lower arm switching elements S1$n and the second $-phase lower arm switching elements S2$n are respectively connected to the boost lower arm connection portion Tcn, the first $-phase lower arm connection portion T1$n and the second $-phase lower arm connection portion T2$n which are arranged on the first surface FC1 of the substrate 150.

The boost lower arm connection portion Tcn and the first $-phase lower arm connection portion T1$n (hereinafter referred to as lower arm connection portion) are arranged to be in series in the long-side direction in a front view of the first surface FC1 of the substrate 150. Also, the first lower arm connection portion Tcn, T1$n are arranged to be in parallel with the first upper arm connection portion Tcp and T1$p. The second $-phase lower arm connection portion T2$n (hereinafter referred to as second lower arm connection portion) are arranged in the long-side direction in a front view of the first surface FC1 of the substrate 150. Also, the second lower arm connection portion T2$n are arranged in parallel to the first lower arm connection portion Tcn and T1$n. The second lower arm connection portion T2$n and the first lower arm connection portion Tcn and T1$n are arranged to be series in a front view of the first surface FC1 of the substrate 150.

The upper arm drive circuits Drcp, Dr1$p and Dr2$p corresponding to the upper arm switching elements Scp, S1$p and S2$p are arranged on the first surface FC1 of the substrate 150. The upper arm drive circuits Drcp, Dr1$p and Dr2$p are arranged in a region opposite to the first lower arm connection portion Tcn and T1$n and the second lower arm connection portion T2$n (hereinafter referred to as lower arm connection portion) with respect to the first upper arm connection portion Tcp and T1$p and the second upper arm connection portion T2$p (hereinafter referred to as upper arm connection portion), in a front view of the first surface FC1 of the substrate 150.

The lower arm drive circuits Drcn, Dr1$n and Dr2$n corresponding to the lower arm switching elements Scn, S1$n and S2$n are arranged on the first surface FC1 of the substrate 150. The lower arm drive circuits Drcn, Dr1$n and Dr2$n are arranged in a region opposite to the upper arm connection portion Tcp, T1$p and T2$p with respect to the lower arm connection portion Tcn and T2$n, in a front view of the first surface FC1 of the substrate 150.

The upper arm drive circuits Drcp, Dr1$p, Dr2$p, the upper arm connection portion Tcp, T1$p and T2$p, the lower arm connection portion Tcn, T1$n and T2$n, and the lower arm drive circuits Drcn, Dr1$n and Dr2$n are arranged in parallel to each other. Hereinafter, a region where the upper arm drive circuit, the upper arm connection portion, the lower arm connection portion and the lower arm drive circuit are arranged, among regions on the substrate 150, is referred to as a connection region Trr. According to the present embodiment, the connection region Trr corresponds to a connection region and a consecutive connection region.

In the connection region Trr, in a front view of the first surface FC1 of the substrate 150, the upper arm drive circuit, the upper arm connection portion, the lower arm connection portion and the lower arm drive circuit are arranged to be in series in the short-side direction. Thus, gates and emitters of switching elements Sc#, S1$# and S2$# can be readily connected to the third terminal T3 and the fourth terminal T4 of respective drive circuits Drc#, Dr1$#.

The first power source control unit CT1 is disposed on the first surface FC1 of the substrate 150. The first power source control unit CT1 is arranged in a region opposite to the upper arm connection portion Tcp, T1$p and T2$p with respect to the upper arm drive circuits Drcp, Dr1$p and Dr2$p in a front view of the first surface FC1 of the substrate 150. In other words, the first power source control unit CT1 is disposed on one side of the connection region Trr with respect to the short-side direction in a front view of the first surface FC1 of the substrate 150.

The first to fourth transformers 60, 62, 64 and 66 to which the first power source control unit CT1 controls are arranged between the first power source control unit CT1 and the connection region Trr in the short-side direction in a front view of the first surface of the substrate 150. Respective transformers 60 to 66 are arranged in rows corresponding to respective upper arm drive circuits in the short-side direction.

The fifth transformer 68 connected to the first power source control unit CT1 is provided in one side of the connection region Trr with respect to the long-side direction in a front view of the first surface FC1 of the substrate 150. Specifically, the fifth transformer 68 is provided close to the first upper arm connection portion Tcp, T1$p among the first upper arm connection portion Tcp and T1$p, and the second upper arm connection portion T2$p arranged to be in series in the long-side direction. Moreover, the fifth transformer 68 is provided, in a front view of the first surface FC1 of the substrate 150, between the first power source control unit CT1 and the connection region Trr in the short-side direction. Hence, the first to fifth transformers 60, 62, 64, 66 and 68 connected to the first power source control unit CT1 are provided in a region opposite to the first lower arm connection portion Tcn, T1$n and the first lower arm drive circuits Drcn, Dr1$n with respect to the first upper arm connection portion Tcp, T1$p and the first upper arm drive circuits Drcp and Dr1$p.

On the other hand, the second power source control unit CT2 is disposed on the first surface FC1 of the substrate 150. The second power source control unit CT2 is provided in a region opposite to the upper arm connection portion Tcp, T1$p, T2$p with respect to the upper arm drive circuits Drcp, Dr1$p and Dr2$p. In other words, the second power source control unit CT2 is located in one side of the connection region Trr with respect to the short-side direction in a front view of the first surface FC1 of the substrate 150.

The sixth to eighth transformers 90, 92 and 94 to which the second power source control unit CT2 controls are arranged between the second power source control unit CT2 and the connection region Trr in the short-side direction in a front view of the first surface of the substrate 150. Respective transformers 90 to 94 are arranged in rows corresponding to respective upper arm drive circuits in the short-side direction.

The ninth transformer 96 connected to the second power source control unit CT2 is provided in the other side of the connection region Trr with respect to the long-side direction in a front view of the first surface FC1 of the substrate 150. Specifically, the eighth transformer 96 is provided close to the second upper arm connection portion T2$p among the first upper arm connection portion Tcp and T1$p, and the second upper arm connection portion T2$p arranged to be in series in the long-side direction. Moreover, the ninth transformer 96 is provided, in a front view of the first surface FC1 of the substrate 150, between the second power source control unit CT2 and the connection region Trr in the short-side direction. Hence, the sixth to eighth transformers 90, 92, 94 and 96 connected to the second power source control unit CT2 are provided in a region opposite to the second lower arm connection portion T2$n and the second lower arm drive circuits Dr2$n with respect to the second upper arm connection portion T2$p and the second upper arm drive circuits Dr2$p.

The fifth transformer 68, the second to fourth transformer 62, 64 and 66, the first transformer 60, the sixth to eighth transformer 90, 92 and 94, the ninth transformer 96 are arranged, in a front view of the first surface FC1 of the substrate 150, to be in series in the long-side direction in this order.

Each of the first transformer terminal Ta1 of the first to fifth transformers 60, 62, 64, 66 and 68 is connected to the low voltage battery 42 via the first wiring pattern L1 (indicated by short dash line in FIG. 5). According to the present embodiment, the first wiring pattern L1 is provided between the first power source control unit Ct1 and the second power source control unit CT2.

The second transformer terminals Tat of the first to fifth transformers 60, 62, 64, 66 and 68 are connected to each other by the second wiring pattern L2 on the substrate 150 (indicated by dotted line in FIG. 5), and connected to the first voltage controlled switching element 80 of the first power source IC 52 by the second wring pattern L2. The fifth transformer 68 is connected to the first lower arm drive circuits Drcn and Dr1$n to which the first power source control unit CT1 controls by the wiring pattern LA (indicated by dotted line in FIG. 5).

According to the present embodiment, the first detection terminal Tfb1 of the first power source IC 52 and the third transformer terminal Ta3 of the third transformer 64 are connected by the first electrical path Lfb1. In other words, the detection terminal Tfb1 of the first power source IC 52 is connected to the third transformer terminal Ta3 of the third transformer 64 disposed at the center portion among the first to fifth transformer 60, 62, 64, 66 and 68 arranged in the long-side direction. The first electrical path Lfb1 is composed of the first feedback circuit 82 (see FIG. 2) and a wiring pattern formed on the substrate 150 and transmits the first feedback voltage Vfb1 to the first power source IC 52. Specifically, the first electrical path Lfb1 is defined as a path from the third transformer terminal Ta3 of the third transformer 64 to the first detection terminal Tfb1 via the first feedback circuit 82.

Also, the first transformer terminal of Ta1 of respective sixth to ninth transformers 90, 92, 94 and 96 is connected to the low voltage battery 42 via the third wiring pattern L3 (indicated by short dash line in FIG. 5) provided on the substrate 150. According to the present embodiment, the third wiring pattern L3 is provided between the first power source unit CT1 and the second power source unit CT2.

The second transformer terminals Tat of the sixth to ninth transformers 90, 92, 94 and 96 are connected to each other by the fourth wiring pattern L4 on the substrate 150 (indicated by dotted line in FIG. 5), and connected to the second voltage controlled switching element 110 of the second power source IC 54 by the fourth wring pattern L4. The ninth transformer 96 is connected to the second lower arm drive circuits Dr2$n to which the second power source control unit CT2 controls, by the wiring pattern LB (indicated by dotted line in FIG. 5).

According to the present embodiment, the second detection terminal Tfb2 of the second power source IC 54, the third transformer terminal Ta3 of the seventh transformer 92 are connected by the second electrical path Lfb2. In other words, the detection terminal Tfb2 of the second power source IC 54 is connected to the third transformer terminal Ta3 of the seventh transformer 92 disposed at the center portion among the sixth to ninth transformer 90, 92, 94 and 96 arranged in the long-side direction. The second electrical path Lfb2 is composed of the second feedback circuit 112 (see FIG. 3) and a wiring pattern formed on the substrate 150, and transmits the second feedback voltage Vfb2 to the second power source IC 54. Specifically, the second electrical path Lfb2 is defined as a path from the third transformer terminal Ta3 of the seventh transformer 92 to the second detection terminal Tfb2 via the second feedback circuit 112.

According to the above-described embodiment, the following effects and advantages can be obtained.

According to the present embodiment, the upper arm transformers, i.e. first to fourth and sixth to eighth transformers 60, 62, 64, 66, 90, 92 and 94, and the lower arm transformers, i.e. fifth and ninth transformers 68 and 96 are arranged between the power source control units CT1 and CT2, and the connection region Trr in the short-side direction in a front view of the first surface FC1 of the substrate 150. That is, the upper arm transformers and the lower arm transformers are disposed close to each other on the first surface FC1 of the substrate 150.

In the case where the upper arm transformers and the lower arm transformers are disposed apart from each other on the first surface FC1 of the substrate 150, lengths L1 and L3 of the wiring pattern between the low voltage battery 42 and respective transformers are different from each other. Thus, when the input impedances between the low voltage battery 42 and the respective transformers are different, voltage difference occurs between voltages supplied to switching elements corresponding to respective transformers.

According to the present embodiment, the upper arm transformers are arranged close to the power source control units CT1 and CT2 with respect to the connection region Trr, and the lower arm transformers are arranged closer to the power source control unit CT1 and CT2 than to an end portion of the connection region Trr which is opposite side of a portion where the power source control units CT1 and CT2 are arranged. Hence, the upper arm transformers and the lower arm transformers can be disposed to be close to each other, compared to a case where the lower arm transformers are arranged in a portion opposite to the power control units CT1 and CT2 with respect to the end portion, that is, a portion opposite to the upper arm transformers with respect to the connection region. Thus, input impedances between the low voltage battery 42 and the primary coils which constitute respective transformers can be prevented from being different. Further, voltage difference can be prevented from occurring in the voltages supplied to the upper arm switching elements Scp, S1$p, S2$p and the lower arm switching elements Scn, S1$n and S2$n.

In particular, the lower arm transformer is provided, in a front view of the first surface of the substrate 150, between the power source control unit CT1 and CT2, and the connection region Trr in the short-side direction. Hence, lengths of the wiring patterns L1 and L3 between the low voltage battery 42 and the respective transformers can be the same, thereby suppressing voltage difference occurring between voltages to be supplied to the upper arm switching elements Scp, S1$p and S2$p, and the lower arm switching elements Scn, S1$n and S2$n.

Here, the reason why the voltage difference occurs in voltages supplied to the switching elements corresponding to respective transformers will be described.

In the case where the lengths of the wiring patterns L1 and L3 are different between the low voltage 42 and the primary coils constituting respective transformers, resistive components and capacitive components in the wiring patterns L1 and L3 are different. Hence, different input impedances occur between the low voltage 42 and the primary coils constituting respective transformers.

Even when difference occurs between the input impedances, when the power source control units CT1 and CT2 detect the voltages transmitted to respective transformers, the control unit 40 controls operational signals outputted to respective drive circuits, whereby the voltages supplied to respective switching elements can be prevented from being different.

However, according to the present embodiment, the power source control units CT1 and CT2 detect only the voltage inputted to a part of the respective transformers. For example, the first power source IC 52 detects the voltage inputted to the third transformer 64, but does not detect the voltages inputted to the other transformers 60, 62, 66 and 68. Hence, when difference in the input impedance exists between the low voltage battery 42 and the primary coils of respective transformers, voltage difference occurs in the respective switching elements. In other words, the voltage difference cannot be prevented from occurring.

According to the present embodiment, the fifth and ninth lower arm transformers 68 and 96 as the lower arm transformers are provided closer to the power control units CT1 and CT2 than to an end portion of the connection region Trr which is opposite side of a portion where the power source control units CT1 and CT2 are arranged, in a front view of the first surface FC1 of the substrate 150. The fifth and ninth lower arm transformers 68 and 96 are located close to the sixth to eighth transformers 60, 62, 64, 66, 90, 92, and 94 as the upper arm transformers. Thus, input impedances between the low voltage battery 42 and the primary coils which constitute respective transformers can be prevented from being different. Hence, voltage difference can be prevented from occurring in the voltages supplied to the upper arm switching elements Scp, S1$p, S2$p and the lower arm switching elements Scn, S1$n and S2$n.

According to the present embodiment, in a front view of the first surface FC1 of the substrate 150, the first to fifth transformers 60, 62, 64, 66 and 68 corresponding to the first power control units CT1 are arranged to be closer to the first upper arm connection portion Tcp, T1$p and the first upper arm drive circuit Drcp, Dr1$p than to the first lower arm connection portion Tcn, T1$n and the first lower arm drive circuits Drcn, Dr1$n. Hence, an increase in the input impedances between the secondary coils 60*b*, 62*b*, 64*b* and 66*b* which constitute the first to fourth transformers 60, 62, 64 and 66, and the first upper arm drive circuits Drcp, Dr1$p can be avoided. Accordingly, voltages supplied to the first upper arm switching elements Scp, S1$p corresponding to the first power control unit CT1 can be preferably prevented from being lowered.

On the other hand, configuration of the present embodiment requires long length for the wiring pattern LA between the secondary coil 68*b* constituting the fifth transformer 68 as the lower arm transformer and the first lower arm drive circuits Drcn and Dr1$n. Generally, since a boost control is performed in the transformer in which the input voltage is boosted to obtain higher output voltage, an amount of output current is lower than an amount of current in the input side. Hence, the wiring pattern LA can be thinner than the wiring pattern L1. Accordingly, in the present embodiment, the length of the wiring pattern LA is longer, but a mounting area required for the substrate 150 can be prevented from being larger compared to a case where the length of the wiring pattern L1 is long. Note that the same applies to the sixth to ninth transformers 90, 92, 94 and 96 corresponding to the second power source control unit CT2.

Second Embodiment

Hereinafter, with reference to the drawings, the second embodiment will be described mainly for configuration which differs from that of the first embodiment.

According to the second embodiment, the number of lower arm transformers corresponding to the power source control units CT1 and CT2 and their arrangement are changed.

FIG. 6 is a plan view of the substrate 150 according to the present embodiment. In FIG. 6, the same components as those shown in FIG. 5 will be applied with the same reference numbers for the sake of convenience.

The first power source control unit CT1 is provided with tenth to thirteenth transformers 130, 132, 134 and 136 as the lower arm transformers. The lower arm transformers are provided individually for respective lower arm switching elements. Specifically, the tenth transformer 130 supplies a drive voltage to the lower arm boost drive circuit Drcn, and the eleventh transformer 132 supplies the drive voltage to the first U-phase lower arm drive circuit Dr1Un. The twelfth transformer 134 supplies a drive voltage to the first V-phase lower arm drive circuit Dr1Vn. The thirteenth transformer 136 supplies a drive voltage to the first W-phase lower arm drive circuit Dr1Wn.

The positive terminal of the low voltage battery 42 is connected to the parallel-connected circuit of the primary coils constituting the first to fourth, tenth to thirteenth transformers 60, 62, 64, 66, 130, 132, 134 and 136 and the negative terminal of the low voltage battery via the first voltage controlled switching element 80. Also, the secondary coils constituting the tenth to thirteenth transformers 130, 132, 134 and 136 are connected to respective lower arm drive circuits Drcn and Dr1$n.

According to the present embodiment, the number of winding of the first to fourth, the tenth to thirteenth secondary coils are the same as the number of winding of the first feedback coil 64*c*. Also, the number of winding of the tenth to thirteenth transformers 130, 132, 134 and 136 as the lower arm transformers are the same as the number of winding of the first to fourth transformers 60, 62, 64 and 66 as the upper arm transformer. Thus, fluctuation of the output voltages of the one to fourth and tenth to thirteenth transformers 60, 62, 64, 66, 130, 132, 134 and 136 can be suppressed.

The first to fourth, tenth to thirteenth transformers 60, 62, 64, 66, 130, 132, 134 and 136 are arranged, in a front view of the first surface FC1 of the substrate 150, such that the twelfth transformer 134, the eleventh transformer 132, the second to fourth transformers 62, 64 and 66, the first transformer 130, the thirteenth transformer 136 are arranged in this order in the long-side direction. In other words, the tenth to thirteenth transformers 130,132, 134, 136 as the lower arm transformers are disposed outside the first to fourth transformers 60, 62, 64 and 66 as the upper arm transformers.

The second power source control unit CT2 is provided with the fourteenth, fifteenth and sixteenth transformers 140, 142 and 144 as the lower arm transformers. The lower transformers are provided individually for respective lower arm switching elements. Specifically, the fourteenth transformers 140 supplies the drive voltage to the second-U-phase lower arm drive circuit Dr2Un. Also, the fifteenth transformers 142 supplies the drive voltage to the second V-phase lower arm drive circuits Dr2Vn. The sixteenth transformer 133 supplied to the second W-phase lower arm drive circuit Dr2Wn.

The positive terminal of the low voltage battery 42 is connected to the parallel connected circuit constituting the sixth to eighth, fourteenth to sixteenth transformers 90, 92, 94, 140 and 144 and the negative terminal of the low voltage battery 42 via the second voltage controlled switching element 110. Also, the secondary coils constituting the fourteenth to sixteenth transformers 140, 142, 144 are connected to respective lower arm drive circuits Dr2$n.

According to the present embodiment, the number of winding of the sixth to eighth, the fourteenth to sixteenth secondary coils are the same as the number of winding of the second feedback coil 92*c*. Also, the number of winding of the fourteenth to sixteenth transformers 140, 142 and 144 as the lower arm transformers are the same as the number of winding of the sixth to eighth transformers 90, 92 and 94 as the upper arm transformer. Thus, fluctuation of the output voltages of the sixth to eighth and fourteenth to sixteenth transformers 90, 92, 94, 140, 142 and 144 can be suppressed.

The sixth to eighth, and fourteenth to sixteenth transformers 90, 92, 94, 140, 142 and 144 are arranged, in a front view of the first surface FC1 of the substrate 150, such that the sixth transformer 90, the fourteenth transformer 140, the seventh transformers 92, the fifteenth transformer 142, the eighth transformer 94 and the sixteenth transformer 144 are arranged in this order in the long-side direction. In other words, the sixth to eighth transformers 90, 92 and 94 as the lower arm transformers and the fourteenth to sixteenth transformers 140, 142 and 144 as the lower arm transformer are alternately disposed in the long-side direction.

According to the above-described embodiment, the tenth to thirteenth transformers 130,132, 134, 136 as the lower arm transformers corresponding to the first power control unit CT1 are disposed, in a front view of the first surface FC1 of the substrate 150, outside the first to fourth transformers 60, 62, 64 and 66 as the upper arm transformers corresponding to the first power source control unit CT1. Hence, the wiring pattern LA which connects the tenth to thirteenth transformers 130, 132, 134 and 136, and the first lower arm drive circuit Drcn, Dr1$n can readily be formed.

Further, in a front view of the first surface FC1 of the substrate 150, the lower arm transformers corresponding to the second power source control unit CT2 and the lower arm transformers corresponding to the second power source unit CT2 are alternately disposed in the long-side direction. Hence, the wiring pattern LB that connects the fourteenth to sixteenth transformers 140, 142 and 144, and the second lower arm drive circuits Dr2$n can be shorter.

Third Embodiment

Hereinafter, with reference to the drawings, the third embodiment will be described mainly for configuration which differs from that of the first embodiment.

According to the present embodiment, the position of the second power source control unit CT2 is changed on the substrate 150.

Figure 7:
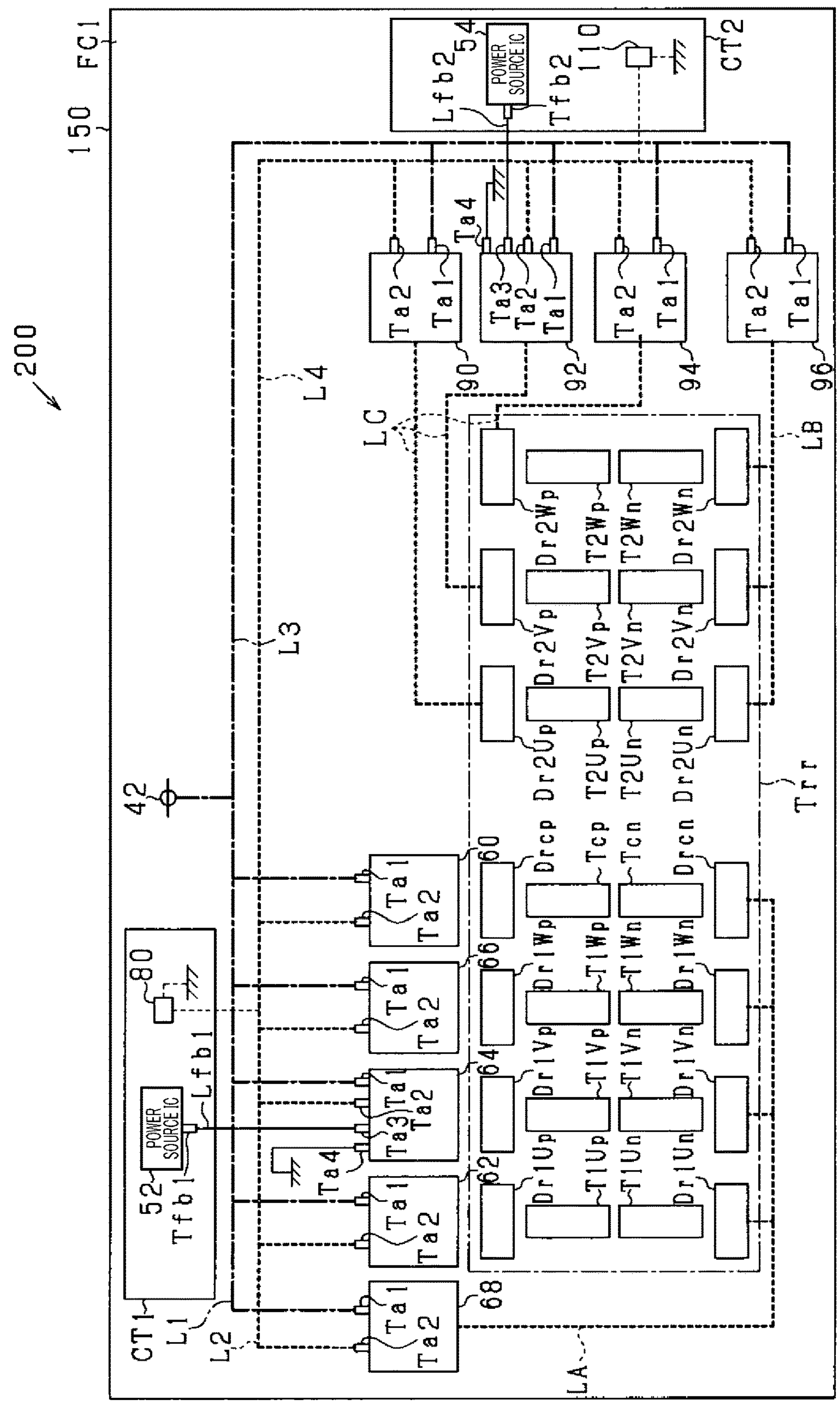
FIG. 7 is a plan view showing an insulated power source apparatus according to a third embodiment.

FIG. 7 is a plan view showing a substrate 150 according to the third embodiment. In FIG. 7, the same components as those shown in FIG. 5 will be applied with the same reference numbers for the sake of convenience.

The second power source control unit CT2 is provided in the other side of the connection region Trr with respect to the long-side direction in a front view of the first surface FC1 of the substrate 150. Specifically, the second power source control unit CT2 is provided close to the second upper arm connection portion T2$p among the first upper arm connection portion Tcp and T1$p, and the second upper arm connection portion T2$p arranged to be in series in the long-side direction. The sixth to ninth transformers 90, 92, 94 and 96 corresponding to the second power source control unit CT2 are provided, in a front view of the first surface FC1 of the substrate 150, between the second power source control unit CT2 and the connection region Trr in the long-side direction. In the second power source control unit CT2 according to the present embodiment corresponds to specific direction.

According to the present embodiment as described above, the sixth to ninth transformers 90, 92, 94 and 96 corresponding to the second power source control unit CT2 are provided in the other side of the connection region Trr in the long-side direction, in a front view of the first surface FC1 of the substrate 150. Accordingly, the length of the wiring pattern LC and the length of the wiring pattern LB provided on the substrate 150 can be substantially the same, where the wiring pattern LC connects between the sixth to eighth transformers 90, 92 and 94 as the upper arm transformers and the second upper arm drive circuits Dr2$p, and the wiring pattern LB connects between the ninth transformer 96 as the lower arm transformer and the second lower arm drive circuit Dr2$n. Hence, voltage difference can be prevented from occurring in the voltages supplied to the second upper and lower arm switching elements S2$p, S2$n.

Fourth Embodiment

Hereinafter, with reference to the drawings, the third embodiment will be described mainly for configuration which differs from that of the first embodiment.

According to the present embodiment, the position of the second power source control unit CT2, and an arrangement of the second upper arm drive circuits Dr2$p, the second upper arm connection portion T2$p, the second lower arm connection portion T2$n and the lower arm drive circuits Dr2$n corresponding to the second power source control unit CT2 are changed.

Figure 8:
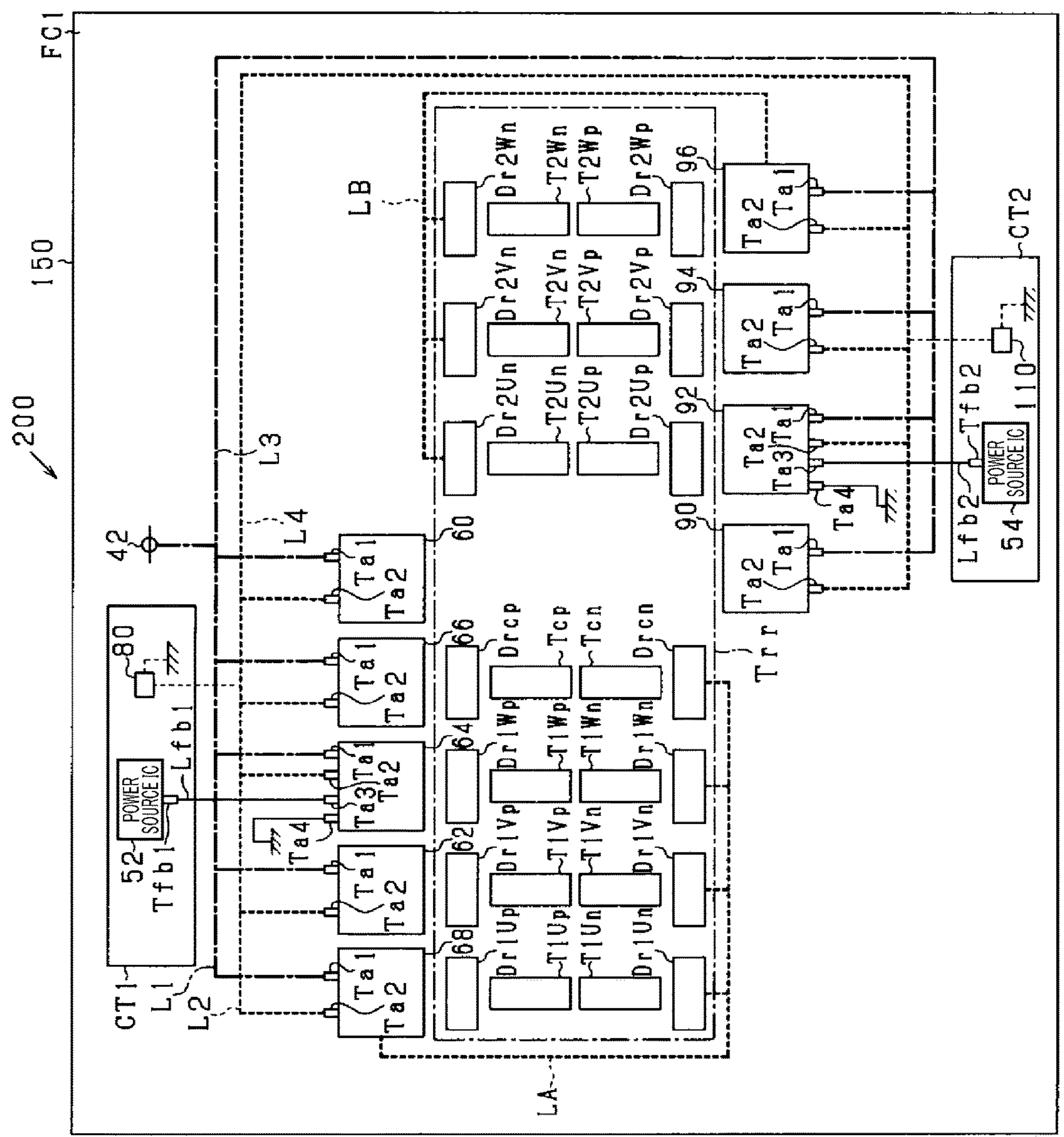
FIG. 8 is a plan view showing an insulated power source apparatus according to a fourth embodiment.

FIG. 8 is a plan view showing a substrate 150 according to the present embodiment. In FIG. 7, the same components as those shown in FIG. 5 will be applied with the same reference numbers for the sake of convenience.

In the connection region Trr, in a front view of the first surface FC1 of the substrate 150, the order of arrangement for the second upper arm drive circuit Dr2$p, the second upper arm connection portions T2$p, the second lower arm connection portions T2$n and the lower arm drive circuits Dr2$n in the short-side direction is opposite to that of the first embodiment. In the connection region Trr, the second upper arm connection portions T2$p and the second upper arm drive circuits Dr2$p is located in the other side of the second lower arm connection portions T2$n and the lower arm drive circuits Dr2$n with respect to the short-side direction, in a front view of the first surface of the substrate 150. In other words, these portions and circuits are arranged in the opposite side of the first power source control unit CT1 in the short-side direction with respect to the connection region Trr.

The first upper arm connection portions Tcp and T1$p, and the second lower arm connection portions T2$n arranged to be in series in a front view of the first surface FC1 of the substrate 150. Also, the first lower arm connection portions Tcn and T1$n, and the second upper arm connection portions T2$p are arranged to be in series in a front view of the first surface FC1 of the substrate 150. Further, the first upper arm drive circuits Drcp and Dr1$p, and the second lower arm drive circuits Dr2$n are arranged to be in series in the longitudinal direction. In addition, the first lower arm drive circuits Drcn and Dr1$n, and the second upper arm drive circuits Dr2$p are arranged to be in series in the longitudinal direction.

The second power source control unit CT2 is provided in the other side of the connection region Trr with respect to the short-side direction in a front view of the first surface FC1 of the substrate 150. The sixth to ninth transformers 90, 92, 94 and 96 to which the second power source control unit CT2 controls are arranged between the second power source control unit CT2 and the connection region Trr in the short-side direction in a front view of the first surface of the substrate 150. In other words, the first to fifth transformers 60, 62, 64, 66 and 68 corresponding to the first power source control unit CT1 and the sixth to ninth transformers 90, 92, 94 and 96 are distributed at the both sides of the connection region Trr in the short-side direction.

Respective transformers are arranged, in a front view of the first surface FC1 of the substrate 150, between one-side end portion and the other side end portion of the connection region Trr in the long-side direction. In other words, respective transformers are arranged, in a front view of the first surface FC1 of the substrate 150, within a region not to extend from the both end portions of the connection region Trr in the long-side direction.

According to the present embodiment as described above, the first to fifth transformers 60, 62, 64, 66 and 68 corresponding to the first power source control unit CT1 and the sixth to ninth transformers 90, 92, 94 and 96 are distributed at the both sides of the connection region Trr in the short-side direction. Therefore, respective transformers can be arranged, in a front view of the first surface of the substrate 150, between one-side end portion and the other side end portion of the connection region Trr in the long-side direction. As a result, the dimension in the long-side direction of the substrate 150 used for arranging the respective transformers can be shorter.

Fifth Embodiment

Hereinafter, with reference to the drawings, the fifth embodiment will be described mainly for configuration which differs from that of the first embodiment.

According to the present embodiment, mounting surface of each transformer on the substrate 150 will be changed.

Figure 9:
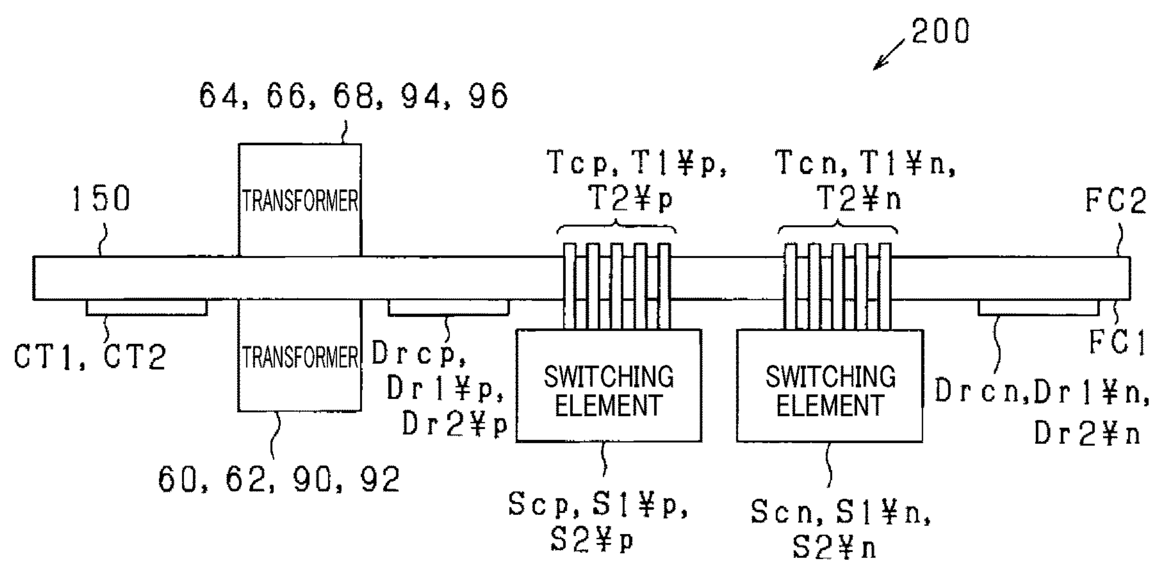
FIG. 9 is a side view showing an insulated power source apparatus according to a fifth embodiment.

FIG. 9 is a side view showing a substrate 150 according to the present embodiment. In FIG. 9, the same components as those shown in FIG. 5 will be applied with the same reference numbers for the sake of convenience.

The substrate 150 according to the present embodiment is a double-sided mounting board capable of connecting electrical components such as transformers on the first surface FC1 and the second surface FC2. According to the present embodiment, the first and second transformers 60 and 62 among the first to fifth transformers 60, 62, 64, 66 and 68 are mounted (connected) to the first surface FC1 of the substrate 150, and remaining transformers, i.e. third to fifth transformers 64, 66 and 68 are mounted to the second surface FC2 of the substrate 150. Further, the sixth and seventh transformers 90 and 92 among the sixth to ninth transformers 90, 92, 94 and 96 corresponding to the second power source control unit CT2 are mounted to the first surface FC1 of the substrate 150, and remaining eighth and ninth transformers 94 and 96 are mounted to the second surface FC2 of the substrate 150. In other words, respective transformers are distributed on the first surface FC1 and the second surface FC2 of the substrate 150.

According to the present embodiment described above, transformers are distributed on the first surface and the second surface of the substrate 150. Thus, the number of transformers mounted on each surface of the substrate 150 can be reduced so that each transformer can be disposed close to the low voltage battery 42. Thus, input impedances between the low voltage battery 42 and the primary coils which constitute respective transformers can be prevented from being different. Further, voltage difference can be prevented from occurring in the voltages supplied to the upper arm switching elements Scp, S1$p, S2$p and the lower arm switching elements Scn, S1$n and S2$n.

Other Embodiments

The present disclosure is not limited to the above-described description. However, the present disclosure may also be embodied in the following manner.

The upper arm switching elements and the lower arm switching elements are not limited to IGBTs but may be MOSFETs.

The specific direction is not limited to the short-side direction of the substrate 150, but may be any directions parallel to the first surface FC1 of the substrate 150.

According to the above-described first embodiment, it was exemplified in which the fifth to ninth transformers 68 and 96 are arranged, in a front view of the first surface FC1 of the substrate 150, between the power source control unit CT1 and CT2 and the connection region Trr in the short-side direction. However, it is not limited thereto. The fifth and ninth transformers 68 and 96 may be arranged, in a front view of the first surface FC1 of the substrate 150, between the one-side end portion and the other side end portion of the connection region Trr in the short-side direction.

In the above-described embodiments, a boost converter 30 may be excluded from the motor control system shown in FIG. 1.

As the motor control system, it is not limited to two motor control system. However, a single motor control system may be used. In this case, either a group corresponding to the first power source control unit CT1, including the first upper arm drive circuits Drcp and Dr1$p, the first upper arm connection portions Tcp and T1$p, the first lower arm connection portion Tcn and T1$n and the lower arm drive circuits Drcn and Dr1$n, or a group corresponding to the second power source control unit CT2, including the second upper arm drive circuits Dr2$p, the second upper arm connection portions T2$p, the second lower arm connection portions T2$n and the lower arm drive circuits Dr2$n is excluded from the insulated power source apparatus 200 shown in FIGS. 5 to 8.

The insulated power source apparatus 200 is not limited to being a fly-back converter. For example, forward type converters may be employed. Also, as the insulated power source converter 200, it is not limited to an apparatus provided with a single voltage controlled switching element. However, a full-bridge converter provided with four voltage controlled switching elements or a push-pull converter provided with two voltage controlled switching elements may be employed.

It is not limited to the third transformer 64 for the transformer that feedbacks the output voltage of the secondary coil to the first power source IC. For example, any one of the first, second, fourth and fifth transformers 60, 62, 66 and 68 may be used. The same applies to the second power source IC 54.

The order of arrangement for the upper arm connection portions Tcp and T1$p, and for the lower arm connection portions Tcn, T1$n and T2$n in the front view of the first surface of the substrate 150 are not limited to those shown in FIGS. 5 to 8.

What is claimed is:

1. An insulated power source apparatus for a power conversion circuit provided with a series-connected circuit composed of an upper arm switching element and a lower arm switching element, the power conversion circuit including a plurality of series connected circuits connected in parallel to each other to generate a parallel-connected circuit, the insulated power source apparatus comprising:

a substrate;

an upper arm transformer mounted on the substrate, including a primary coil capable of being connected to a DC power source, and a secondary coil capable of supplying an upper arm drive power to the upper arm switching element;

a lower arm transformer mounted on the substrate, including a primary coil capable of being connected to the DC power source, and a secondary coil capable of supplying a lower arm drive power to the lower arm switching element;

a wiring provided on the substrate, connecting the primary coil constituting each of the upper arm transformer and the lower arm transformer, and the DC power source;

a power source control unit mounted on the substrate, including a control switch and a control circuit, the control switch switching between ON and OFF to apply voltage of the DC power source to the primary coil constituting each of the upper arm transformer and the lower arm transformer, and the control circuit turning the control switch ON and OFF;

a plurality of upper arm connection portions connecting a plurality of upper arm switching elements to the substrate; and a plurality of lower arm connection portions connecting a plurality of upper arm switching elements to the substrate, wherein the control switch is provided to be capable of forming a closed circuit including the DC power source, a plurality of primary coils constituting the upper arm transformer and the lower arm transformer and the control switch, when the control switch is turned ON;

the power source control unit is disposed on one side of a connection region on the substrate where the upper arm connection portions and the lower arm connection portions are provided, with respect to a specific direction parallel to a plate surface of the substrate;

the upper arm transformer is arranged between the power source control unit and the connection region in the specific direction; and the lower arm transformer is arranged closer to the power source control unit in the specific direction than to an end portion of the connection region which is opposite side of a portion where the power source control unit is arranged.

2. The insulated power source apparatus according to claim 1, wherein the lower arm transformer is arranged between the power source control unit and the connection region in the specific direction.

3. The insulated power source apparatus according to claim 2, wherein in the connection region, the plurality of upper arm connection portions are arranged to be in series in a front view of the plate surface of the substrate;

the plurality of lower arm connection portions are arranged in a direction along which the plurality of upper arm connection portions are arranged, and provided to be in parallel to the plurality of upper arm connection portions in the front view of the plate surface of the substrate;

the specific direction is defined as a direction perpendicular to the direction along which the plurality of upper arm connection portions are arranged; and the plurality of upper arm connection portions are arranged at one side in the specific direction with respect to the plurality of lower arm connection portions.

4. The insulated power source apparatus according to claim 2, wherein in the connection region, the plurality of upper arm connection portions are arranged to be in series in the front view of the plate surface of the substrate;

the plurality of lower arm connection portions are arranged in a direction along which the plurality of upper arm connection portions are arranged, and provided to be in parallel to the plurality of upper arm connection portions in the front view of the plate surface of the substrate; and the specific direction is defined as a direction along which the upper arm connection portions are arranged.

5. The insulated power source apparatus according to claim 2, wherein the power conversion circuit includes a first power conversion circuit and a second power conversion circuit;

the connection region of the first power conversion circuit and the connection region of the second power conversion circuit are arranged in a direction perpendicular to the specific direction;

the power source control unit of the first power conversion circuit and the power source control unit of the second power conversion circuit are provided on mutually opposite sides in the specific direction with respect to a consecutive connection region constituted of the connection region of the first power conversion circuit and the connection region of the second power conversion circuit;

power source control units of the first power conversion circuit and the second power conversion circuit, upper arm transformers corresponding to the first power conversion circuit and the second power conversion circuit, and lower arm transformers corresponding to the first power conversion circuit and the second power conversion circuit are arranged, in a direction perpendicular to the specific direction, between one side end portion and the other side end portion of the consecutive connection region.

6. The insulated power source apparatus according to claim 2, wherein the circuit board is configured of a double-sided mounting board having a first plate surface on which a part of transformers among the upper arm transformer and the lower arm transformer are connected and a second plate surface on which remaining transformers are connected.

* * * * *